United States Patent [19]

Sakurai et al.

[11] Patent Number: 5,650,980
[45] Date of Patent: Jul. 22, 1997

[54] SEMICONDUCTOR MEMORY DEVICE UTILIZING TWO DATA LINE PAIRS AND REALIZING HIGH-SPEED DATA READOUT

[75] Inventors: Mikio Sakurai; Miki Nakahira, both of Hyogo, Japan

[73] Assignee: Mitsubishi Denki Kabushiki Kaisha, Tokyo, Japan

[21] Appl. No.: 667,341

[22] Filed: Jun. 20, 1996

Related U.S. Application Data

[63] Continuation of Ser. No. 416,664, Apr. 5, 1995, abandoned.

[30] Foreign Application Priority Data

Apr. 11, 1994 [JP] Japan .................................. 6-072197

[51] Int. Cl.$^6$ ........................................................ G11C 8/00
[52] U.S. Cl. ........................................... 365/236; 365/203
[58] Field of Search ..................................... 365/203, 236, 365/235, 189.05, 208, 238.5

[56] References Cited

U.S. PATENT DOCUMENTS 4,941,128  7/1990  Wada ...................................... 365/203
5,416,743  5/1995  Allan ....................................... 365/203

FOREIGN PATENT DOCUMENTS 1-14792  1/1989  Japan .

Primary Examiner—Amir Zarabian
Attorney, Agent, or Firm—Lowe, Price, LeBlanc & Becker

[57] ABSTRACT

One of the two data input/output line pairs and the selected bit line pair included in a memory cell array are connected by a column switch, and the read out data is output to a preamplifier through a switching circuit. A data input/output line pair of the data input/output line pairs which is not used for data transmission is equalized by an equalizing circuit. Therefore, data readout and equalizing operation are carried out in parallel, thereby achieving high-speed data readout.

22 Claims, 9 Drawing Sheets

FIG. 2
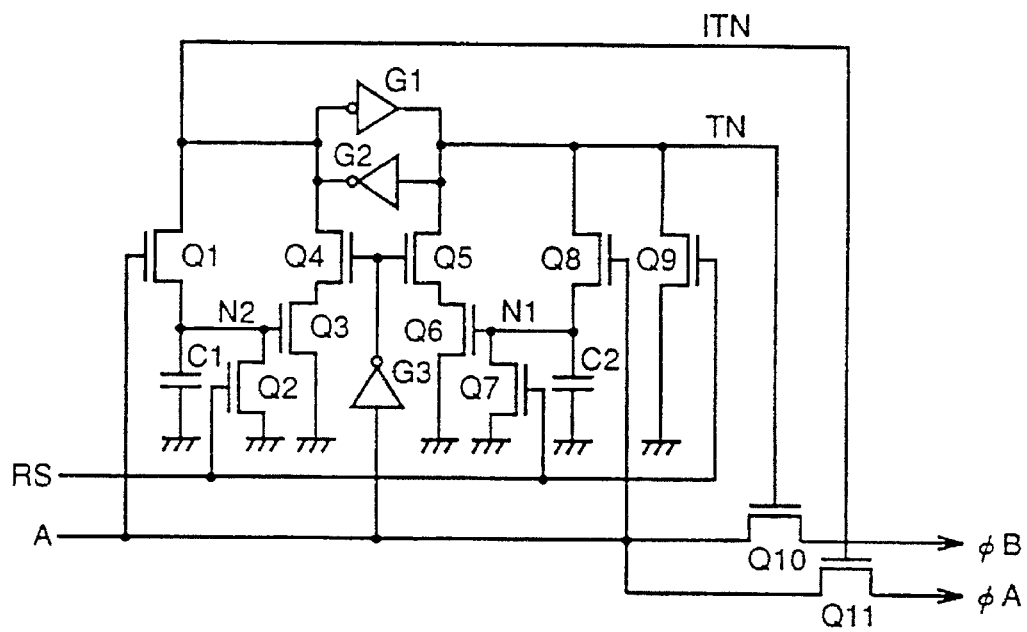
FIG. 3(a)   RS
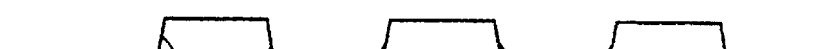
FIG. 3(b)   A
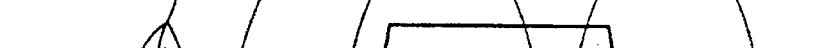
FIG. 3(c)   N1
FIG. 3(d)   N2
FIG. 3(e)   TN
FIG. 3(f)   ITN
FIG. 3(g)   φB
FIG. 3(h)   φA

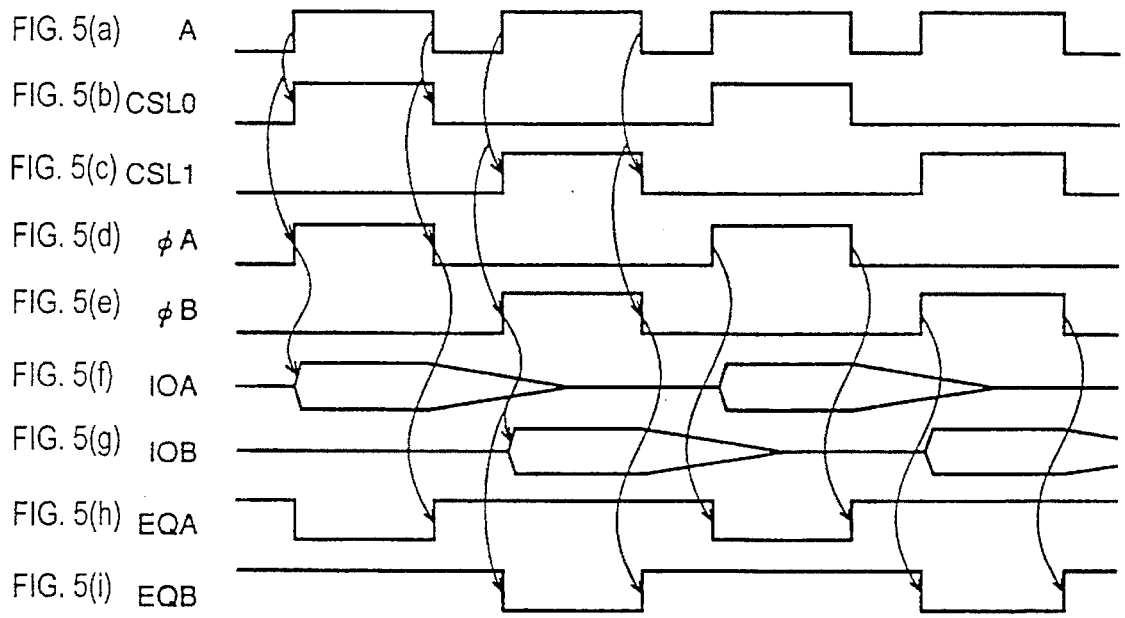
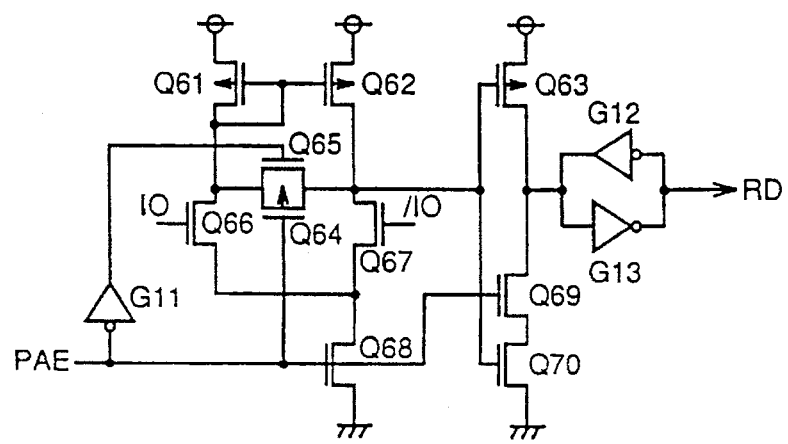

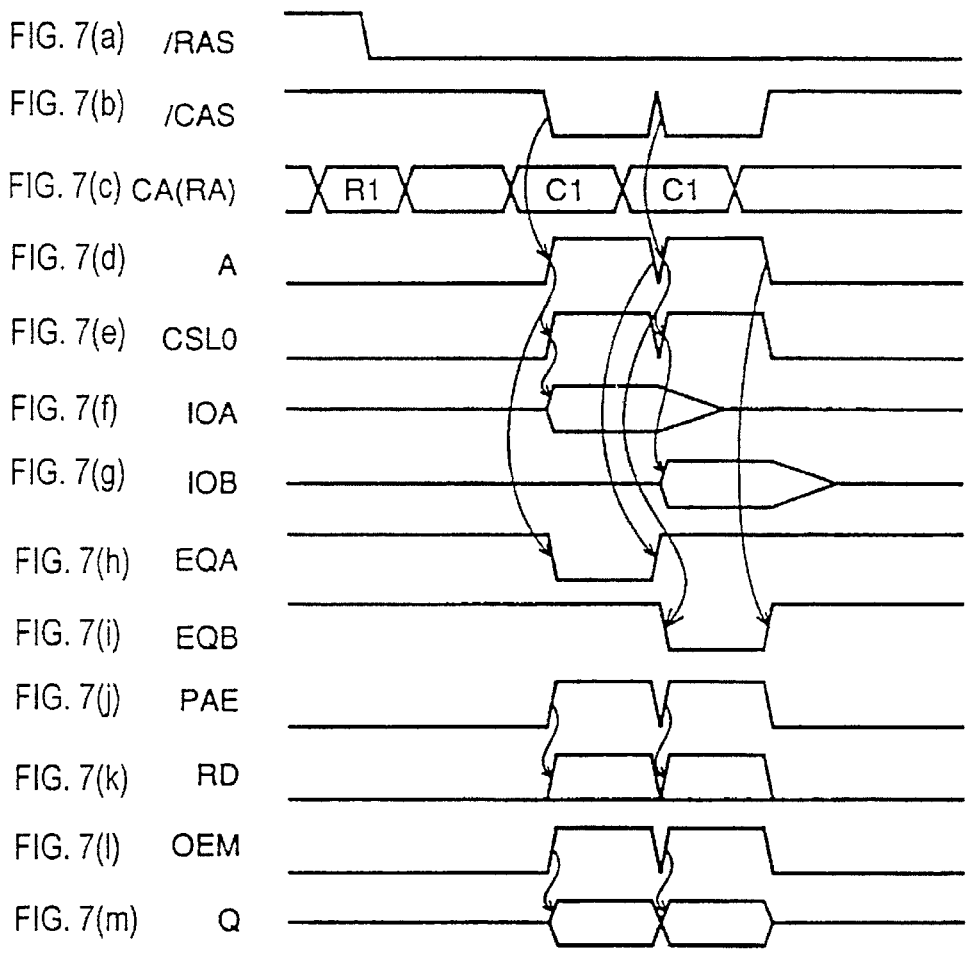
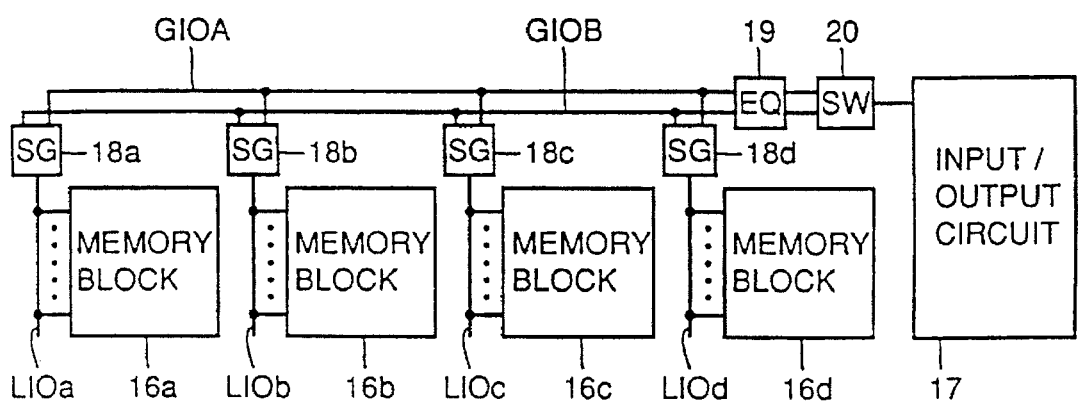
FIG. 8

PRIOR ART
FIG. 12(a)  A
FIG. 12(b)  CSL0
FIG. 12(c)  CSL1
FIG. 12(d)  IO
FIG. 12(e)  EQ
PRIOR ART
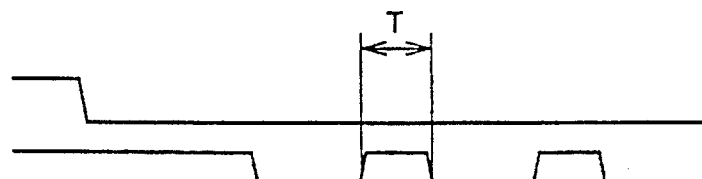
FIG. 13(a)  /RAS
FIG. 13(b)  /CAS
FIG. 13(c)  CA(RA)
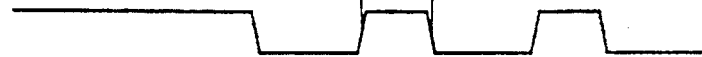
FIG. 13(d)  CSL0
FIG. 13(e)  CSL1
FIG. 13(f)  IO
FIG. 13(g)  PAE
FIG. 13(h)  RD
FIG. 13(i)  OEM
FIG. 13(j)  Q

SEMICONDUCTOR MEMORY DEVICE UTILIZING TWO DATA LINE PAIRS AND REALIZING HIGH-SPEED DATA READOUT

This application is a continuation of application Ser. No. 08/416,664 filed Apr. 5, 1995 now abandoned.

BACKGROUND OF THE INVENTION

1. Field of the Invention

The present invention relates to semiconductor memory devices. More particularly, the present invention relates to a semiconductor device having a data line for transmitting data which is output from a memory cell array.

2. Description of the Background Art

In accordance with increase in density and integration of semiconductor memory devices, a data line pair for transmitting data which is read out from a memory cell array is increased in length and density. Furthermore, a data line pair tends to have more capacity than before, resulting in longer equalizing time of the data line pair. However, it is necessary to reduce the equalizing time and to read out data at a high speed for fast operation of semiconductor memory devices.

Now, a conventional semiconductor memory device will be described with reference to the drawings. FIG. 10 is a block diagram showing a structure of a DRAM (Dynamic Random Access Memory), conventional semiconductor memory device.

Referring to FIG. 10, the semiconductor memory device includes a control circuit 101, a row address buffer 102, a column address buffer 103, a row decoder 104, a memory cell array 105, a sense amplifier portion 106, a column switch 107, a column decoder 108, an equalizing circuit 110, a preamplifier 112, a main amplifier 113, a writing circuit 114, and a data buffer 115.

Control circuit 101 receives such external control signals as a row address strobe signal/RAS ("/" indicates an inverted signal), a column address strobe signal /CAS and a write enable signal /WE, and outputs a prescribed control signal to internal blocks. Row address buffer 102 receives an external row address signal RA and outputs an internal row address signal to row decoder 104. Column address buffer 103 receives an external column address signal CA and outputs an internal column address signal to column decoder 108. Column address buffer 103 activates column decoder 108 and outputs to column decoder 108 a column control signal A changing in response to column address signal CA.

Memory cell array 105 includes a plurality of word lines connected to the row decoder, a plurality of bit line pairs arranged crossing the word lines, and a plurality of memory cells arranged at the intersections of the word lines and the bit line pairs. Row decoder 104 activates a prescribed word line in response to the internal row address signal. Column decoder 108 turns on column switch 107 in response to the internal column address signal and connects the selected bit line pair and a data input/output line pair IO. Data of the selected memory cell is transmitted through the bit line pair, amplified at sense amplifier portion 106, and is output to data input/output line pair IO through column switch 107.

Equalizing circuit 110 equalizes and precharges data input/output line pair IO before data is read out to data input/output line pair IO. Data which is read out to the equalized data input/output line pair IO is input to preamplifier 112. Preamplifier 112 amplifies the signal transmitted through data input/output line pair IO in response to a preamplifier enable signal PAE, and outputs the amplified signal to main amplifier 113 as a read data signal RD. Main amplifier 113 amplifies read data signal RD in response to an output enable signal OEM, and outputs the amplified signal as an output data Q.

In writing operation, an input data Din is input externally to data buffer 115, which latches input data Din in response to a data in latch signal DIL and outputs the data to writing circuit 114. Writing circuit 114 transmits the input data to data input/output line pair IO in response to a write data enable signal WDE. The data transmitted to data input/output line pair IO is sent through column switch 107 to a prescribed bit line pair and data is written in a prescribed memory cell.

Next, the column switch shown in FIG. 10 will be described in detail. FIG. 11 shows a specific structure of the column switch shown in FIG. 10.

Referring to FIG. 11, column switch 107 includes NMOS transistors Q91–Q94. Equalizing circuit 110 includes NMOS transistors Q95–Q97. Memory cell array 105 includes a word line WL, bit line pairs BL0, /BL0 and BL1, /BL1 ("/" indicates a complementary signal line) and a memory cell MC. Only two bit lines are shown in FIG. 11 for illustrative purpose.

A plurality of word lines WL are connected to row decoder 104, which activates a prescribed word line WL in response to the input internal row address signal.

A plurality of bit line pairs BL0, /BL0 and BL1, /BL1 are arranged to cross the plurality of word lines WL, and a memory cell MC is disposed at each intersection. When word line WL is activated, data stored in memory cell MC is read out to the corresponding bit line pair. The plurality of bit line pairs BL0, /BL0 and BL1, /BL1 are connected to sense amplifiers (SA) 106a and 106b, respectively. Data of the bit line pair corresponding to the activated word line WL is amplified by the sense amplifier.

Transistor Q91 is connected to bit line BL0 and data input/output line IO. Transistor Q92 is connected to bit line /BL0 and data input/output line /IO. Transistors Q91 and Q92 receive at their gates a column selection signal CSL0 which is output from column decoder 108. Transistors Q93 and Q94 make a similar connection and operate in a similar manner. In order to connect a prescribed bit line pair and the data input/output line pair based on the input internal column address signal and column control signal A, column decoder 108 raises the column selection signal from "L" (Low) to "H" (High), turns on the corresponding transistor, and connects the bit line pair and the data input/output line pair. As a result, the data amplified by the sense amplifier is transmitted to data input/output line pair IO, /IO through column switch 107.

Data input/output line pair IO, /IO is connected to equalizing circuit 110. Transistor Q95 equalizes data input/output line pair IO, /IO in response to an equalizing signal EQ. Transistors Q96 and Q97 precharge data input/output line pair IO, /IO at a prescribed precharge voltage $V_{BL}$ in response to equalizing signal EQ. After data input/output line pair IO, /IO is equalized and precharged by equalizing circuit 110, data amplified by the sense amplifier is read out to data input/output line pair IO, /IO, and then is input to preamplifier 112. Preamplifier 112 further amplifies the input data, and outputs the resulting data to main amplifier 113 as read data signal RD.

Next, operation of the above column switch will be described in detail. FIGS. 12(a) to 12(e) are timing charts illustrating operation of the column switch shown in FIG. 11.

FIGS. 12(a) to 12(e) show an example where bit line pair BL0, /BL0 is selected first and then bit line pair BL1, /BL1 is selected. When column control signal A rises from "L" to "H", column control signal CSL0 rises to "H". As a result, transistors Q91 and Q92 turn on, and data of bit line pair BL0, /BL0 is read out to data input/output line pair IO, /IO.

When column control signal A falls from "H" to "L" after a prescribed time period, column control signal CSL0 falls from "H" to "L". Consequently, transistors Q91 and Q92 turn off, and data transmission from bit line pair BL0, /BL0 to data input/output line pair IO, /IO is terminated. When column control signal A falls from "H" to "L", equalizing signal EQ rises from "L" to "H". With the rise of equalizing signal EQ, transistors Q95, Q96 and Q97 turn on, and data input/output line pair IO, /IO is equalized and precharged at a prescribed potential.

Next, when column control signal A rises from "L" to "H", column control signal CSL1 rises from "L" to "H", transistors Q93 and Q94 turn on, and bit line pair BL1, /BL1 and data input/output line pair IO, /IO are connected. As a result, data of bit line pair BL1, /BL1 is read out to data input/output line pair IO, /IO.

When column control signal A rises from "L" to "H", equalizing signal EQ falls from "H" to "L", and transistors Q95, Q96 and Q97 turn off, thereby terminating equalizing and precharging operation.

As described above, equalizing and precharging operation has been carried out for a prescribed time period whenever data is read out from a prescribed bit line pair to data input/output line pair IO, /IO.

Operation of a conventional semiconductor memory device utilizing the column switch above will now be described in detail. FIGS. 13(a) to 13(j) are timing charts illustrating operation of the semiconductor memory device shown in FIG. 10.

Referring to FIGS. 13(a) to 13(j), the externally applied row address strobe signal /RAS falls to "L" and an externally applied row address signal R1 is read. Row decoder 104 activates word line WL corresponding to row address signal R1.

Next, the externally applied column address strobe signal /CAS falls from "H" to "L" and an externally applied column address signal C1 is read. Column decoder 108 raises column control signal CSL0 from "L" to "H" in order to connect data input/output line pair IO, /IO and bit line pair BL0, /BL0 corresponding to column address signal C1. Transistors Q91 and Q92 turn on in response to column control signal CSL0 and data is read to data input/output line pair IO, /IO. Preamplifier 112 amplifies the data read out to data input/output line pair IO, /IO in response to preamplifier enable signal PAE and outputs the amplified data to main amplifier 113 as read data signal RD. Main amplifier 113 further amplifies the input read data signal RD in response to output enable signal OEM and outputs the resultant data as output data Q.

After a prescribed time period, when column address strobe signal /CAS rises from "L" to "H", column control signal CSL0 falls from "H" to "L", terminating readout of data. At this time, preamplifier enable signal PAE and output enable signal OEM also fall from "H" to "L", and output of data from preamplifier 112 and main amplifier 113 is terminated.

For a time T, data input/output line pair IO, /IO is equalized and precharged by equalizing circuit 110 so as to read out next data.

After time T has passed, column address strobe signal /CAS falls from "H" to "L" and column address signal C2 is read. Data readout continues in a similar manner, and data which is read out from bit line pair BL1, /BL1 is transmitted to data input/output line pair IO, /IO, amplified by and output as output data Q from main amplifier 113.

As described above, in a conventional semiconductor memory device, equalizing time T has been required before data which is read out from the bit line pair is transmitted to data input/output line pair IO, /IO. Equalizing time T requires, for example, at least 10 ns even in the fast page mode, giving rise to a problem that data readout cannot be achieved at high speed.

When equalizing time T is reduced, it takes time to invert data of data input/output line pair IO, /IO because the input/output line pair cannot be fully equalized. Therefore, this approach cannot achieve high-speed data readout, either.

SUMMARY OF THE INVENTION

One object of the present invention is to provide a semiconductor memory device which can achieve high-speed data readout without being affected by an equalizing time.

A semiconductor memory device in accordance with one aspect of the present invention includes a memory cell array having a plurality of word lines, a plurality of bit line pairs arranged crossing the word lines, a plurality of memory cells located at intersections of the word lines and the bit line pairs, first and second data input/output line pairs for transmitting data which is output from the memory cell array and data which is input to the memory cell array, a connection circuit for selectively connecting the bit line pair selected upon readout and one pair of the first and second data input/output line pairs, and an equalizing circuit for equalizing the other pair of the first and second data input/output line pairs which is not used for data transmission.

With the above structure, since the first and second data input/output line pairs for transmitting data which is output from the memory cell array and data which is input to the memory cell array and the bit line pair selected in reading operation are selectively connected and the data input/output line pair which is not used for data transmission is equalized, one of the data input/output line pairs can be used for data transmission while the other data input/output line pair is equalized. As a result, the equalizing time does not affect data readout time, thereby realizing high-speed data readout. Furthermore, the first and second data input/output line pairs can be utilized as data line pair for input. By utilizing the first and second data input/output line pairs also for data input, integration level can be further enhanced.

Preferably, the semiconductor memory device further includes a control signal output circuit for outputting a control signal which alternately selects one of the first and second data input/output line pairs in response to a selection signal for selecting a bit line pair.

Since one of the first and second data input/output line pairs is alternately selected in response to the selection signal for selecting a bit line pair, the equalizing time need not be taken into account to input the selection signal, thereby simplifying a circuit for selecting the first and second data input/output line pairs.

A semiconductor memory device in accordance with another aspect of the present invention includes a memory cell array having a plurality of word lines, a plurality of bit line pairs arranged crossing the word lines, and a plurality of memory cells located at intersections of the word lines and the bit line pairs, first and second data line pairs for transmitting only the data output from the memory cell array, a connection circuit for selectively connecting one of the first and second data line pairs and the bit line pair selected in reading operation, and an equalizing circuit for equalizing the other pair of the first and second data line pairs which is not used for data transmission.

In the above structure, since the first and second data line pairs for transmitting only the data output from the memory cell array and the bit line pair selected in reading operation are selectively connected and the data line pair which is not used for data transmission is equalized, the equalizing time does not affect the data readout time, thereby realizing high-speed data readout.

A semiconductor memory device in accordance with a further aspect of the present invention includes a memory cell array having a plurality of word lines, a plurality of bit line pairs arranged crossing the word lines, and a plurality of memory cells located at intersections of the word lines and the bit line pairs, a sub data line pair for transmitting data output from the memory cell array, first and second main data line pairs for transmitting data sent from the sub data line pair, a connection circuit for selectively connecting one of the first and second main data line pairs and the sub data line pair, and an equalizing circuit for equalizing the other main data line pair of the first and second main data line pairs which is not used for data transmission.

By utilizing the above structure, since the sub data line pair and one of the first and second main data line pairs are selectively connected and the other main data line pair which is not used for data transmission is equalized, equalizing time does not affect a time to read data from the sub data line pair to the main data line pair, thereby realizing high-speed data readout.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a circuit diagram showing an example of a counter shown in FIG. 1.

FIGS. 3(a) to 3(h) are timing charts illustrating operation of the counter shown in FIG. 2.

FIGS. 5(a) to 5(i) are timing charts illustrating operation of the column switch shown in FIG. 4.

FIG. 6 is a circuit diagram showing an example of a preamplifier shown in FIG. 1.

FIGS. 7(a) to 7(m) are timing charts illustrating operation of the semiconductor memory device shown in FIG. 1.

FIG. 8 is a block diagram showing a structure of a semiconductor memory device in accordance with another embodiment of the present invention.

FIGS. 12(a) to 12(j) are timing charts illustrating operation of the column switch shown in FIG. 11.

FIGS. 13(a) to 13(j) are timing charts showing operation of the semiconductor memory device shown in FIG. 10.

DESCRIPTION OF THE PREFERRED EMBODIMENTS

Figure 1:
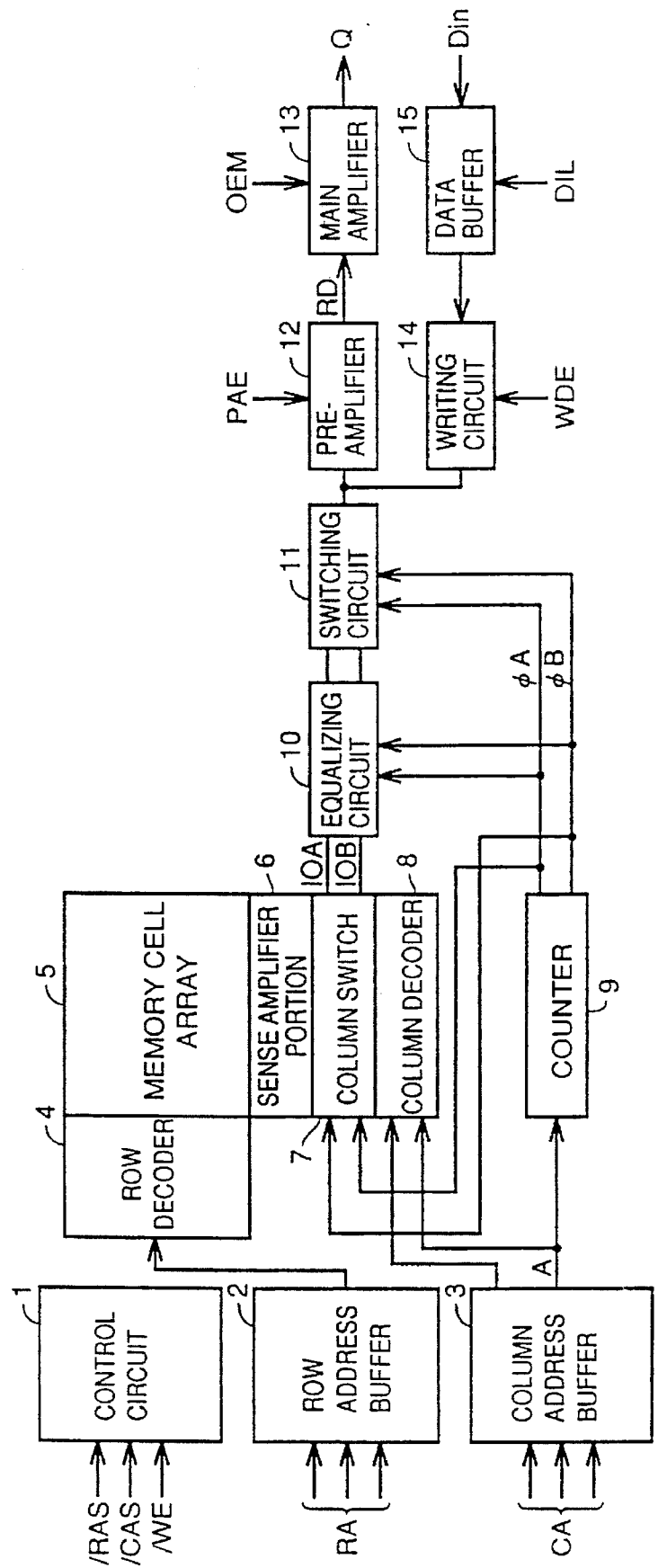
FIG. 1 is a block diagram showing a structure of a semiconductor memory device in accordance with one embodiment of the present invention.

Now, one embodiment of a semiconductor memory device in accordance with the present invention will be described with reference to the drawings. FIG. 1 is a block diagram showing a structure of a semiconductor memory device in accordance with one embodiment of the present invention.

Although a DRAM (Dynamic Random Access Memory) is shown as an example in FIG. 1, the present invention can be similarly applied to other semiconductor memory devices.

Referring to FIG. 1, the semiconductor memory device includes a control circuit 1, a row address buffer 2, a column address buffer 3, a row decoder 4, a memory cell array 5, a sense amplifier portion 6, a column switch 7, a column decoder 8, a counter 9, an equalizing circuit 10, a switching circuit 11, a preamplifier 12, a main amplifier 13, a writing circuit 14, and a data buffer 15.

Control circuit 1 receives externally applied control signals such as a row address strobe signal /RAS, a column address strobe signal /CAS, and a write enable signal /WE, and outputs a prescribed internal control signal to respective blocks in the device.

Row address buffer 2 receives an externally applied row address signal RA and outputs an internal row address signal to row decoder 4.

Column address buffer 3 receives an externally applied column address signal CA and outputs to column decoder 8 an internal column address signal corresponding to column address signal CA, activates column decoder 8, and outputs to column decoder 8 and counter 9 a column control signal A which changes in response to the column address signal.

Although row address signal RA and column address signal CA are input individually to respective buffers in FIG. 1, row address signal RA and column address signal CA can be input to one buffer in time-divisional manner, and then the corresponding internal row address signal is output to row decoder 4 and the corresponding internal column address signal is output to column decoder 8.

Memory cell array 5 includes a plurality of word lines connected to row decoder 4, a plurality of bit line pairs each connected to a sense amplifier in sense amplifier portion 6, and a plurality of memory cells located at intersections of the word lines and the bit line pairs.

Row decoder 4 selects and activates a prescribed word line corresponding to the internal row address signal. Data of the memory cell connected to the activated word line is read out to the bit line pair and amplified at sense amplifier portion 6.

Column decoder 8 activates a prescribed column control signal in response to the input internal column address signal, turns on a prescribed switch of column switch 7 and connects the corresponding bit line pair and one of the two data input/output line pairs IOA and /IOB. As a result, the data amplified at sense amplifier portion 6 is read out to one of data input/output line pairs IOA, /IOB through the bit line pair.

Counter 9 outputs control signals φA and φB, which will be described later, to column switch 7, equalizing circuit 10 and switching circuit 11 in response to column control signal A. Control signals φA and φB control selective use of the data input/output line pairs IOA and IOB. Column switch 7 connects a prescribed bit line pair and a prescribed data input/output line pair in response to control signals φA and φB.

Equalizing circuit 10 equalizes and precharges one of data input/output line pairs IOA and IOB which is not used for data transmission, in response to control signals φA and φB. After equalizing and precharging operation, data is transmitted to data input/output line pairs IOA and IOB and applied to switching circuit 11.

Switching circuit 11 outputs data of one of data input/output line pairs IOA and IOB to preamplifier 12 in response to control signals φA and φB.

Preamplifier 12 amplifies the input data in response to a preamplifier enable signal PAE and outputs the amplified data to main amplifier 13 as a read data signal RD.

Main amplifier 13 further amplifies the applied read data signal RD in response to an output enable signal OEM and outputs the amplified signal as an output data Q.

When data is written, an input data Din is applied to data buffer 15, latched in response to a data in latch signal DIL, and is output to writing circuit 14.

Writing circuit 14 outputs the applied data to switching circuit 11 in response to a write data enable signal WDE. Switching circuit 11 transmits data to one data line pair of data input/output line pairs IOA and IOB in response to control signals φA and φB. Data is written in a prescribed memory cell in memory cell array 5 through column switch 7.

Next, the counter circuit shown in FIG. 1 will be described in detail. FIG. 2 is a circuit diagram showing an example of the counter circuit shown in FIG. 1.

Referring FIG. 2, the counter circuit includes NMOS transistors Q1–Q11, capacitors C1 and C2, and inverters G1–G3.

Transistor Q1 is connected to a ground potential through capacitor C1 and also connected to inverters G1 and G2, transistor Q4 and a gate of transistor Q11. Transistor Q1 receives column control signal A at its gate. Transistor Q2 is connected to the ground potential and a node N2 between transistor Q1 and capacitor C1, and receives a reset signal RS at its gate. Transistor Q3 is connected to transistor Q4 and the ground potential and receives the potential of node N2 at its gate. Transistor Q4 is connected to inverters G1 and G2 and has a gate connected to the gate of transistor Q5 and inverter G3. Column control signal A is applied to inverter G3. Transistor Q5 is connected to inverters G1 and G2 and transistors Q6, Q8 and Q9 and the gate of transistor Q10. Transistor Q6 is connected to the ground potential and has a gate connected to transistors Q7 and Q8 and capacitor C2. Transistor Q7 is connected to the ground potential and receives reset signal RS at its gate. Transistor Q8 is connected to the ground potential through capacitor C2 and has a gate connected to transistor Q11. Transistor Q9 is connected to the ground potential and receives reset signal RS at its gate. Transistors Q10 and Q11 receive column control signal A.

Operation of the counter structured as above will be described. FIGS. 3(a) to 3(h) are timing charts illustrating operation of the counter circuit shown in FIG. 2.

Referring to FIGS. 3(a) to 3(h), when a reset state ends with reset signal RS falling from "H" to "L", the counter circuit outputs control signals φA and φB, which will be described later, in response to column control signal A. With reset signal RS being "L", transistors Q8 and Q1 turn on when column control signal A rises from "L" to "H". At this time, a node N1 is "L" because a node TN is "L", and node N2 rises from "L" to "H" because the potential of a node ITN is "H". Since the potential of node TN is "L", transistor Q10 is off, column control signal A is not output, and control signal φB is "L". On the other hand, since the potential of node ITN is "H", transistor Q11 turns on, column control signal A is output, and control signal φA changes from "L" to "H".

When column control signal A falls from "H" to "L", transistors Q8 and Q1 are off. At this time, the potential of node N1 is "L" and the potential of node N2 is "H". Column control signal A is inverted by inverter G3 and applied to the gates of transistors Q4 and Q5, thereby turning on these transistors. On the other hand, transistor Q6 is off because the potential of node N1 is "L". Since the potential of node N2 is "H", transistor Q3 turns on, and the potential of node ITN falls from "H" to "L". When the potential of node ITN falls from "H" to "L", the potential of node TN rises from "L" to "H" by inverters G1 and G2. Therefore, transistor Q11 turns off and control signal φA falls from "H" to "L".

Similar operation follows, so that next time column control signal A rises from "L" to "H", control signal φB rises from "L" to "H", and when column control signal A falls from "H" to "L", control signal φB falls from "H" to "L".

By the above-described operation, the odd waveform of column control signal A is output as control signal φA and the even waveform thereof is output as control signal φB. The above counter is merely an example and other binary counters can also be employed.

Figure 4:
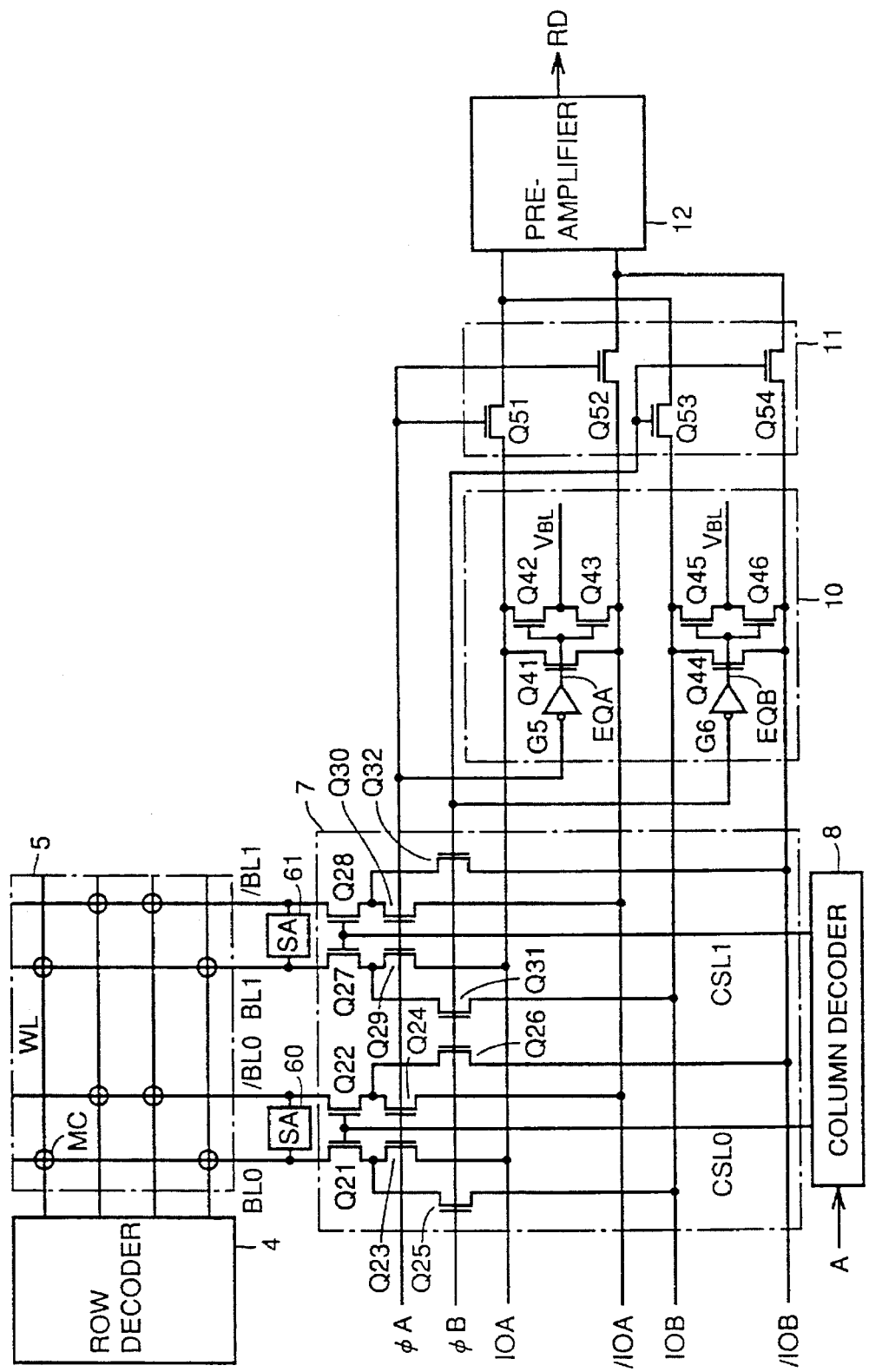
FIG. 4 shows a specific structure of a column switch shown in FIG. 1.

Next, the column switch shown in FIG. 1 will be described in detail. FIG. 4 shows a specific structure of the column switch shown in FIG. 1. Although a memory cell array including two bit line pairs is shown in FIG. 4 as an example for simplicity of description, memory cell arrays including more than two bit line pairs can be similarly applied.

Referring to FIG. 4, the memory cell array includes a plurality of word lines WL, a plurality of bit line pairs BL0, /BL0 and BL1, /BL1 crossing word lines WL, a plurality of memory cells MC located at intersections of word lines WL and bit line pairs BL0, /BL0 and BL1, /BL1. A one transistor, one capacitor type memory cell is used as memory cell MC.

Sense amplifiers (SA) 60 and 61 are connected to the corresponding bit line pairs BL0, /BL0 and BL1, /BL1, and amplify data which is read out to bit line pairs BL, /BL0 and BL1, /BL1.

Column switch 7 includes NMOS transistors Q21–Q32. Transistor Q21 is connected to bit line BL0 and transistors Q23 and Q25 and receives column selection signal CSL0 from column decoder 8 at its gate. Transistor Q23 is connected to data input/output line IOA and receives control signal φA at its gate. Transistor Q25 is connected to data input/output line IOB and receives control signal φB at its gate. Transistor Q22 is connected to bit line /BL0 and transistors Q24 and Q26 and receives column selection signal CSL0 at its gate like transistor Q21. Transistor Q24 is connected to data input/output line /IOA and receives control signal φA at its gate. Transistor Q26 is connected to data input/output line /IOB and receives control signal φB at its gate. Transistors Q27–Q32 are connected as transistors Q21–Q26 are. The same applies to the case where more bit line pairs are provided.

Equalizing circuit 10 includes transistors Q41–Q46 and inverters G5 and G6. Transistor Q41 is connected to data input/output lines IOA and /IOA and receives control signal φA through inverter G5 at its gate. Transistor Q42 is connected to data input/output line IOA and transistor Q43. Transistor Q43 is connected to input/output line /IOA. Transistors Q42 and Q43 receive control signal φA through inverter G5 at their gates, and a prescribed precharge voltage $V_{BL}$ is applied to the connection point between transistors Q42 and Q43. Transistors Q44–Q46 are connected to data input/output line pair IOB, /IOB in a similar manner.

Switching circuit 11 includes NMOS transistors Q51–Q54. Transistor Q51 is connected to data input/output line IOA and preamplifier 12, and receives control signal φA at its gate. Transistor Q52 is connected to data input/output line /IOA and preamplifier 12, and receives control signal CA at its gate. Transistors Q53 and Q54 are similarly connected to data input/output line pair IOB, /IOB and preamplifier 12.

Now, operation of the column switch having such structure as described above will be described in detail. FIGS. 5(a) to 5(i) are timing charts illustrating operation of the column switch shown in FIG. 4. FIGS. 5(a) to 3(i) shows an example where data is read alternately from two bit line pairs BL0, /BL0 and BL1, /BL1.

Referring to FIG. 5, when column control signal A is input to column decoder 8, column decoder 8 alternately outputs column selection signals CSL0 and CLS1 in response to column control signal A. By the counter circuit described above, control signals φA and φB are alternately applied in an "H" state to column switch 7, equalizing circuit 10 and switching circuit 11 in response to column control signal A.

When column selection signal CSL0 rises from "L" to "H", transistors Q21 and Q22 turn on and bit line pair BL0, /BL0 and transistors Q23–Q26 are connected. Since control signal φA rises from "L" to "H" and control signal φB is in an "L" state, transistors Q23 and Q24 turn on and transistors Q25 and Q26 turn off. Therefore, bit line pair BL0, /BL0 and data input/output line pair IOA, /IOA are connected through transistors Q21–Q24, and the data amplified at sense amplifier 60 is read out to data input/output line pair IOA, /IOA.

At this time, since control signal φA is at an "H" level, transistors Q51 and Q52 turn on and the data read out to data input/output line pair IOA, /IOA is output to preamplifier 12.

When column control signal A falls from "H" to "L", column selection signal CSL0 falls from "H" to "L", thereby turning off transistors Q21 and Q22. As a result, bit line pair BL0, /BL0 and data input/output line pair IOA, /IOA are disconnected.

By contrast, when control signal φA drops from "H" to "L", equalizing signal EQA rises from "L" to "H" through inverter G5. With equalizing signal EQA attaining an "H" level, transistors Q41–Q43 turn on and data input/output line pair IOA, /IOA is equalized by transistor Q41, and data input/output line pair IOA, /IOA is precharged at precharge voltage $V_{BL}$ by transistors Q42 and Q43.

When column control signal A rises from "L" to "H", column selection signal CSL1 rises from "L" to "H" and transistors Q27 and Q28 turn on. When column control signal A rises from "L" to "H", control signal φB rises from "L" to "H", transistors Q31 and Q32 turn on, and bit line pair BL1, /BL1 and data input/output line pair IOB, /IOB are connected. When control signal φB rises from "L" to "H", equalizing signal EQB falls from "H" to "L" by inverter G6. This terminates the equalizing operation by transistor Q44 and precharging operation by transistors Q45 and Q46, and the data amplified by sense amplifier 61 is read out to data input/output line pair IOB, /IOB. Meanwhile, with equalizing signal EQA at "H" level, data input/output line pair IOA, /IOA are kept equalized and precharged.

When column control signal A falls from "H" to "L", column selection signal CSL1 falls from "H" to "L" and transistors Q27 and Q28 turn off, thereby terminating data readout from bit line pair BL1, /BL1 to data input/output line pair IOB, /IOB. Control signal φB falls from "H" to "L" in response to column control signal A, and equalizing signal EQB rises from "L" to "H" by inverter G6. Consequently, transistors Q44–Q46 turn on, data input/output line pair IOB, /IOB is equalized by transistor Q44 and precharged at precharge voltage $V_{BL}$ by transistors Q45 and Q46.

By the above-described operation, one data input/output line pair can be equalized while the other pair is used for data transmission, so that equalizing time will not affect data readout time to the data input/output line pair. As a result, data can be constantly read out to one data input/output line pair taking no account of equalizing time, thereby realizing very fast readout of data. Furthermore, the data input/output line pair shown in FIG. 4 can be used for both reading and writing data, providing the structure suitable for high integration.

Although only two bit line pairs BL0, /BL0 and BL1, /BL1 are provided in the embodiment of FIG. 4, desired data can be read out alternately to two data input/output line pairs IOA, /IOA and IOB, /IOB in a similar manner with a structure having more bit line pairs as well, by connecting each bit line pair alternately to the data input/output line pair and similarly operating the column switch in response to control signals φA and φB. If a plurality of memory cell arrays are provided, each block may have its own control signals φA and φB. In this case, data can be read out from the bit line pair to two data input/output line pairs alternately on a block by block basis at its own timing.

Now, the preamplifier shown in FIG. 1 will be described in detail. FIG. 6 is a circuit diagram showing an example of the preamplifier shown in FIG. 1.

Referring to FIG. 6, the preamplifier includes PMOS transistors Q61–Q64, NMOS transistors Q65–Q70, and inverters G11–G13.

A signal IO which is output from data input/output lines IOA and IOB is applied to the gate of transistor Q66. A signal /IO which is output from data input/output lines /IOA and/IOB is applied to the gate of transistor Q67. Transistor Q66 is connected to transistors Q68, Q64, Q67 and Q61. Transistor Q67 is connected to transistors Q68 and Q62. Transistors Q61 and Q62 are connected to a supply voltage Vcc. Transistors Q61 and Q62 have their gates connected to the connection point between transistors Q61 and Q66. Preamplifier enable signal PAE is applied to inverter G11 and to the gates of transistors Q64 and Q68. Inverter G11 is connected to the gate of transistor Q65. Transistors Q64 and Q65 are connected to the connection point between transistors Q61 and Q66 and the connection point between transistors Q62 and Q67. Transistor Q68 is connected to the ground potential. Transistors Q61–Q62 and Q64–Q68 and inverter G11 constitute a current mirror amplifier with the above-described structure.

Transistor Q63 is connected to supply voltage $V_{CC}$ and transistor Q69. Transistor Q63 has a gate connected to the connection point between transistors Q62 and Q67 and the gate of transistor Q70. Transistor Q69 receives preamplifier enable signal PAE at its gate and connected to transistor Q70. Transistor Q70 is connected to the ground potential.

Inverters G12 and G13 are connected to the connection point between transistors Q63 and Q69 and outputs read data signal RD. As such, transistors Q63, Q69 and Q70 and inverters G11 and G13 form an amplifying circuit.

Having details of the above-described structure, when preamplifier enable signal PAE is "H", the preamplifier amplifies the data signal input from data input/output line pair IO, /IO, latches at inverters G12 and G13 and outputs the signal as read data signal RD.

Now, details of operation of the semiconductor memory device having such structure as described above is as follows. FIGS. 7(a) to 5(m) are timing charts illustrating operation of the semiconductor memory device shown in FIG. 1. FIGS. 7(a) to 7(m) shows an example where two data are successively read out in the fast page mode with equalizing time T shown in FIGS. 13(a to 13(j) being approximately 0 ns.

Referring to FIG. 7, when the externally applied row address strobe signal /RAS falls from "H" to "L", row address signal R1 is read and row decoder 4 activates a prescribed word line corresponding to row address signal R1.

Next, when the externally applied column address strobe signal /CAS falls from "H" to "L", column address signal C1 is read. When column address strobe signal /CAS falls, column control signal A rises from "L" to "H", and a column selection signal corresponding to column address signal C1, in this case column selection signal CSL0, rises from "L" to "H". When column selection signal CSL0 rises, bit line pair BL0, /BL0 and data input/output line pair IOA, /IOA are connected, so that data is read out to data input/output line pair IOA, /IOA.

When column control signal A rises, equalizing signal EQA falls from "H" to "L", thereby terminating equalizing operation of data input/output line pair IOA, /IOA and data is read out as described above. Meanwhile, since equalizing signal EQB is at "H" level, equalizing operation for data input/output line pair IOB, /IOB is carried out.

Data read out to data input/output line pair IOA, IOA is output to main amplifier 13 as read data signal RD during the time when preamplifier enable signal PAE is "H". Main amplifier 13 outputs the input read data signal RD as output data Q while output enable signal OEM is "H".

When column address strobe signal /CAS rises from "L" to "H", column control signal A falls from "H" to "L". When column control signal A falls, column selection signal CSL0 falls from "H" to "L", thereby terminating readout of data. If column control signal A falls, equalizing signal EQA rises from "L" to "H", thereby initiating equalizing operation of data input/output line pair IOA, /IOA.

When column address strobe signal /CAS falls from "H" to "L", next column address signal C1 is read. When column address strobe signal /CAS falls, column control signal A rises from "L" to "H" and column selection signal CSL0 corresponding to column address signal C1 rises again from "L" to "H". At the same time, since control signal φB also rises from "L" to "H", bit line pair BL0, /BL0 and data input/output line pair IOB, /IOB are connected, so that data of bit line pair BL0, /BL0 is read to data input/output line pair IOB, /IOB.

When column control signal A rises, equalizing signal EQB falls from "H" to "L", thereby terminating equalizing operation of data input/output line pair IOB, /IOB. Therefore, data is read out as described above to data input/output line pair IOB, /IOB for which equalizing operation is completed.

The read out data is output to main amplifier 13 as read data signal RD during the time when preamplifier enable signal PAE is "H". Main amplifier 13 outputs the amplified signal as output data Q while output enable signal OEM is "H".

As described above, since one data input/output line pair is equalized while the other data input/output line pair receives data, equalizing time does not affect data readout time at all. More specifically, although a conventional semiconductor memory device requires an equalizing time of approximately 10 ns in column address strobe signal /CAS for successive data readout as shown in FIG. 13, the data input/output line pair is equalized while it is not used for data output in the present embodiment, so that equalizing time T can be reduced to approximately 0 ns, thereby realizing high-speed data readout.

Although the same bit line pair receives two successive data in the above example, data can be similarly read out to different bit line pairs or more than two data can be successively read out. In these cases also, equalizing time does not affect data readout time at all and data can be read at a very high speed.

Although the above-described embodiment relates to the data input/output line pairs for both input and output operations, data line pairs for reading only can be applied similarly and provide the similar effect. In this case, switching circuit 11 shown in FIG. 1 is connected only to preamplifier 12, but the rest of the structure is identical to that of the semiconductor memory device shown in FIG. 1.

Next, a semiconductor memory device in accordance with another embodiment of the present invention will be described with reference to the drawings. FIG. 8 is a block diagram showing a structure of the semiconductor memory device in accordance with another embodiment of the present invention. FIG. 8 shows an example in which the present invention is applied to global data input/output line pair and local data input/output line pair.

Referring to FIG. 8, the semiconductor memory device includes memory blocks 16a–16b, select gates 18a–18d, an I/O input/output circuit 17, an equalizing circuit (EQ) 19, and a switching circuit (SW) 20.

Four memory blocks 16a–16d include row decoder 4, memory cell array 5, sense amplifier portion 6, column switch 7, column decoder 8 and the like shown in FIG. 1. Control circuit 1, row address buffer 2, column address buffer 3, counter circuit 9 and the like are not shown. Memory blocks 16a–16d are connected respectively to local data input/output line pairs LIOa–LIOd, which receive data read out from respective memory blocks. Local data input/output line pairs LIOa–LIOd are connected to two global data input/output line pairs GIOA and/GIOB through select gates 18a–18d respectively. Global data input/output line pairs GIOA and GIOB are provided with equalizing circuit 19, which performs equalizing operation of global data input/output line pairs GIOA and GIOB. Only one of global data input/output line pairs GIOA and GIOB is connected to I/O input/output circuit 17 by switching circuit 20.

Figure 9:
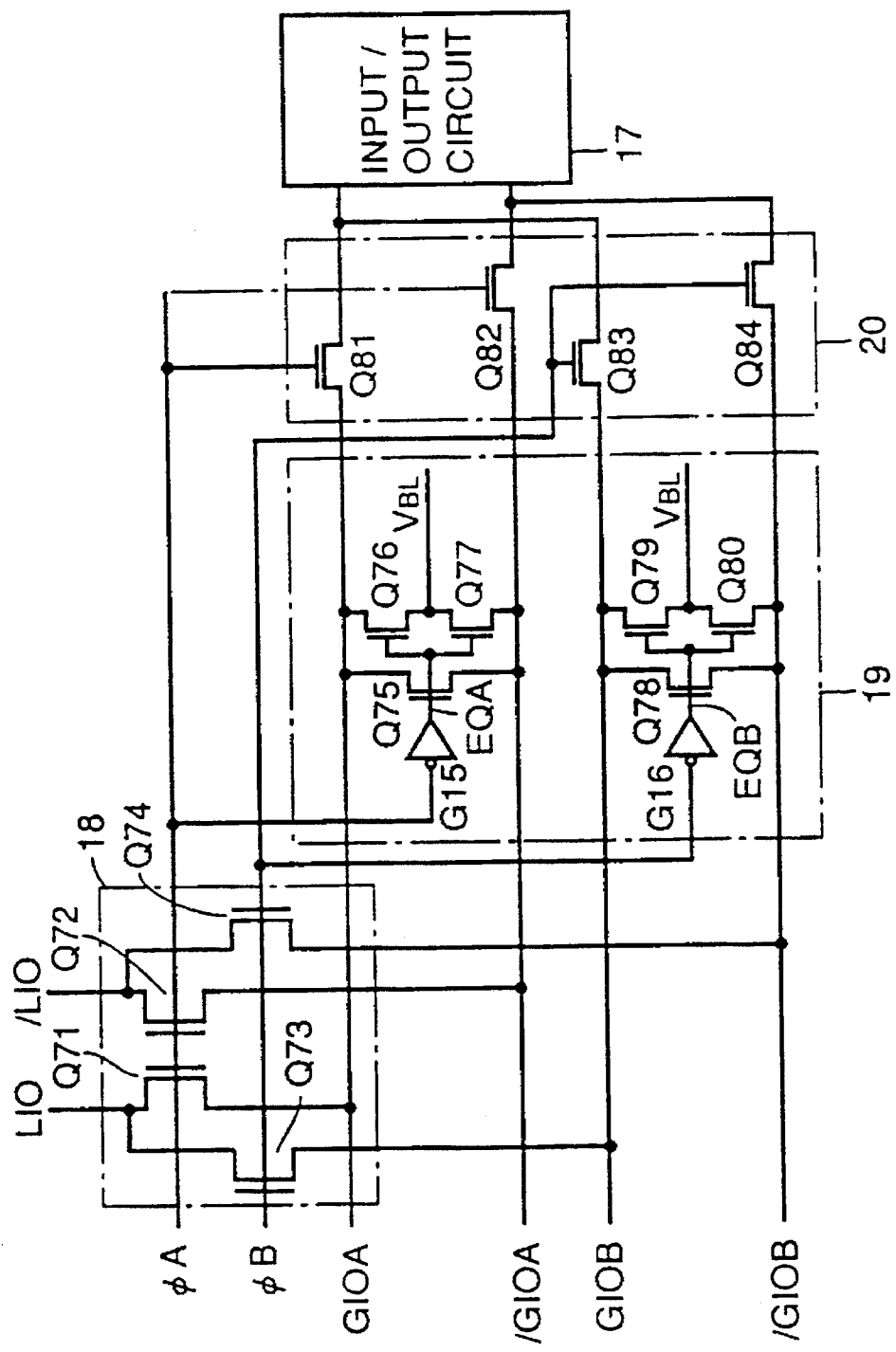
FIG. 9 shows a specific structure of a select gate shown in FIG. 8.
Figure 10:
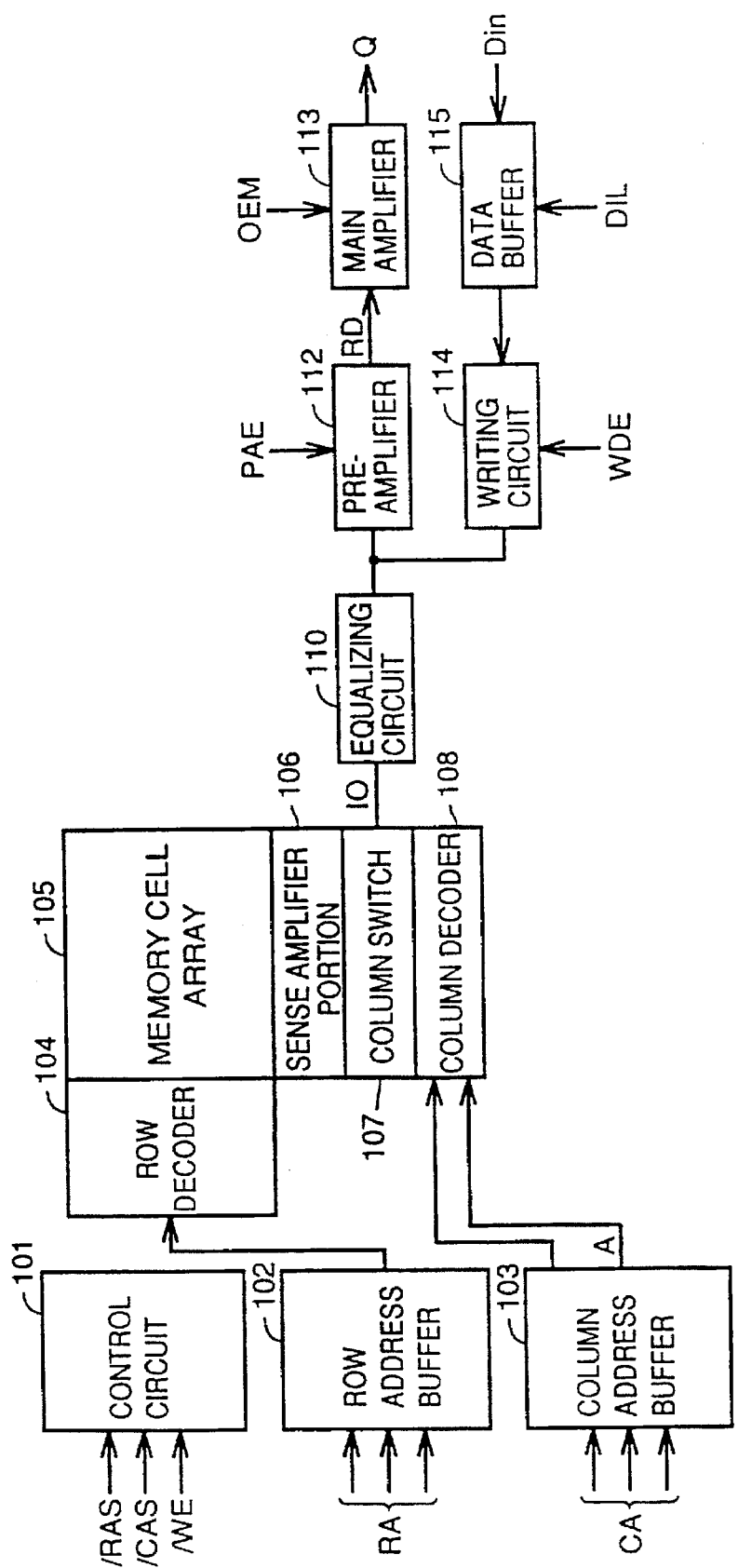
FIG. 10 is a block diagram showing a structure of a conventional semiconductor memory device.
Figure 11:
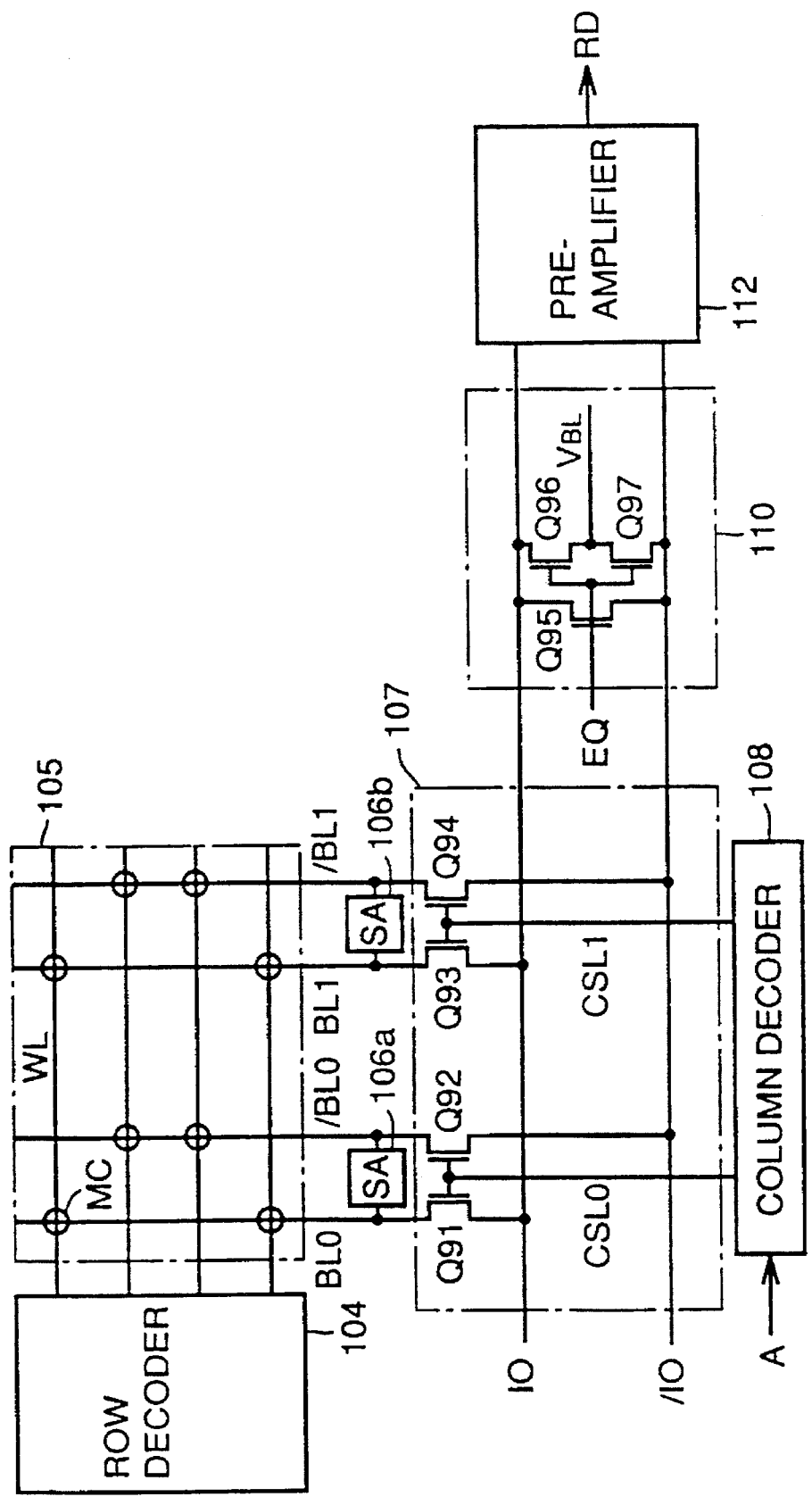
FIG. 11 shows a specific structure of a column switch shown in FIG. 10.

Next, the select gate shown in FIG. 8 will be described in detail. FIG. 9 shows a specific structure of the select gate shown in FIG. 8.

Referring to FIG. 9, select gate 18 includes NMOS transistors Q71–Q74. Transistor Q71 is connected to local data input/output line LIO and global data input/output line GIOA. Transistor Q72 is connected to local data input/output line /LIO and global data input/output line /GIOA. Transistors Q71 and Q72 receive control signal φA at their gates. Transistor Q73 is connected to local data input/output line LIO and global data input/output line /GIOB. Transistor Q74 is connected to local data input/output line /LIO and global data input/output line GIOB. Control signal φB is applied to the gates of transistors Q73 and Q74. Control signals φA and φB are generated, for example, by the counter shown in FIG. 2. With the above structure, select gate 18 selectively connects local data input/output line pair LIO, /LIO and global data input/output line pair GIOA, /GIOA or GIOB, /GIOB in response to control signals φA and φB. Therefore, as the semiconductor device shown in FIG. 1, data which is read out from local data input/output line pair LIO, /LIO is transmitted to global data input/output line pair GIOA, /GIOA or GIOB, /GIOB.

Equalizing circuit 19 includes inverters G15 and G16 and transistors Q75–Q80. Since the structure of equalizing circuit 19 is the same as that of the equalizing circuit shown in FIG. 4, the description thereof will not be repeated. As the semiconductor device shown in FIG. 1, equalizing circuit 19 performs equalizing operation of the global data input/output line pair which is not used for data transmission.

Switching circuit 20 includes NMOS transistors Q81–Q84. Since switching circuit 20 is constructed similarly to the switching circuit shown in FIG. 4, the description thereof will not be repeated.

With such a structure as described above, in the semiconductor memory device of the present embodiment, data of local data input/output line pair LIO, /LIO is read out to global data input/output line pair GIOA, /GIOA or GIOB, /GIOB, applied to input/output circuit 17 and is finally output as output data, as the semiconductor memory device shown in FIG. 1. The global data input/output line pair which is not used for data transmission is equalized by equalizing circuit 19, so that equalizing time does not affect data readout time at all, thereby achieving data readout at a very high speed. The present embodiment is especially effective when equalizing time is long, for example, when a global data input/output line pair is longer than a local data input/output line pair or when the capacity of the global data input/output line pair is large.

The above embodiment relates to a semiconductor memory device having four memory blocks. However, a semiconductor memory device having other numbers of memory blocks, or a semiconductor memory device having a plurality of blocks with a structures shown in FIG. 8 can provide a remarkable effect especially when the global data input/output line pair is longer than the local data input/output line pair.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory cell array including a plurality of word lines, a plurality of bit line pairs arranged crossing said word lines, and a plurality of memory cells located at intersections of said word lines and said bit line pairs;
first and second data input/output line pairs for transmitting data output from said memory cell array and data input to said memory cell array;
connection means for selectively connecting one of said first and second data input/output line pairs and said bit line pair selected upon readout;
an equalizing means for equalizing the other pair of said first and second data input/output line pairs which is not used for data transmission;
control siqnal output means for outputting a control signal which alternately selects one of said first and second data input/output line pairs in response to a selection signal for selecting said bit line pair; and
a column address buffer for receiving an externally applied column address signal and outputting a column control signal which changes in response to said column address signal, wherein
said control signal output means includes
a counter for receiving said column control signal and alternately outputting first and second control signals which alternately selects one of said first and second data input/output line pairs in response to said column control signal.

2. A semiconductor memory device, comprising:
a memory cell array including a plurality of word lines, a plurality of bit line pairs arranged crossing said word lines, and a plurality of memory cells located at intersections of said word lines and said bit line pairs;
first and second data input/output line pairs for transmitting data output from said memory cell array and data input to said memory cell array;
connection means for selectively connecting one of said first and second data input/output line pairs and said bit line pair selected upon readout;
an equalizing means for equalizing the other pair of said first and second data input/output line pairs which is not used for data transmission;
control signal output means for outputting a control signal which alternately selects one of said first and second data input/output line pairs in response to a selection signal for selecting said bit line pair; and
a column address buffer for receiving an externally applied column address signal and outputting a column control signal which changes in response to said column address signal, wherein
said control signal output means includes
a counter for receiving said column control signal and alternately outputting first and second control signals which alternately selects one of said first and second data input/output line pairs in response to said column control signal, and
said counter includes
a first NMOS transistor having a gate which receives said column control signal,
a first inverter having an input end connected to one end of said first NMOS transistor,
a second inverter having an output end connected to the input end of said first inverter and an input end connected to an output end of said first inverter,
a capacitor having one end connected to an other end of said first NMOS transistor and an other end receiving a ground potential,
a second NMOS transistor having one end connected to a connection point between said first NMOS transistor and said first capacitor, an other end receiving the ground potential, and a gate receiving a predetermined reset signal,
a third NMOS transistor having one end connected to said one end of said first NMOS transistor,
a fourth NMOS transistor having one end connected to an other end of said third NMOS transistor, an other end receiving the ground potential and a gate connected to the connection point between the other end of said first NMOS transistor and said first capacitor, a fifth NMOS transistor having one end connected to the output end of said first inverter and the input end of said second inverter, a third inverter having an input end receiving said column control signal and an output end connected to gates of said third and fifth NMOS transistors, a sixth NMOS transistor having one end connected to an other end of said fifth NMOS transistor and an other end receiving the ground potential, a seventh NMOS transistor having one end connected to a gate of said sixth NMOS transistor, an other end receiving the ground potential and a gate receiving said reset signal, an eighth NMOS transistor having one end connected to the output end of said first inverter and to the input end of said second inverter, an other end connected to the gate of said sixth NMOS transistor and said one end of said seventh NMOS transistor, and a gate receiving said column control signal, a second capacitor having one end connected to said an other end of said eighth NMOS transistor, and an other end receiving the ground potential, a ninth NMOS transistor having one end connected to the output end of said first inverter and to the input end of said second inverter, an other end receiving the ground potential, and a gate receiving said reset signal, a tenth NMOS transistor having one end receiving said column control signal and a gate connected to the output end of said first inverter and to the input end of said second inverter, and an eleventh NMOS transistor having one end receiving said column control signal and a gate connected to said one end of said first NMOS transistor.

3. A semiconductor memory device, comprising:

a memory cell array including a plurality of word lines, a plurality of bit line pairs arranged crossing said word lines, and a plurality of memory cells located at intersections of said word lines and said bit line pairs;

first and second data input/output line pairs for transmitting data output from said memory cell array and data input to said memory cell array;

connection means for selectively connecting one of said first and second data input/output line pairs and said bit line pair selected upon readout;

an equalizing means for equalizing the other pair of said first and second data input/output line pairs which is not used for data transmission;

control signal output means for outputting a control signal which alternately selects one of said first and second data input/output line pairs in response to a selection signal for selecting said bit line pair; and a column address buffer for receiving an externally applied column address signal and outputting a column control signal which changes in response to said column address signal, wherein said control signal output means includes
a counter for receiving said column control signal and alternately outputting first and second control signals which alternately selects one of said first and second data input/output line pairs in response to said column control signal, said connection means includes
a first NMOS transistor having one end connected to one bit line of a prescribed bit line pair of said plurality of bit line pairs, a second NMOS transistor having one end connected to an other end of said first NMOS transistor, an other end connected to one data input/output line of said first data input/output line pair, and a gate receiving said first control signal, a third NMOS transistor having one end connected to said other end of said first NMOS transistor, and an other end connected to one data input/output line of said second data input/output line pair, and receiving said second control signal, a fourth NMOS transistor having one end connected to an other bit line of said predetermined bit line pair, a fifth NMOS transistor having one end connected to an other end of said fourth NMOS transistor, an other end connected to an other data input/output line of said first data input/output line pair, and a gate receiving said first control signal, and a sixth NMOS transistor having one end connected to said an other end of said fourth NMOS transistor, an other end connected to an other data input/output line of said second data input/output line pair, and a gate receiving said second control signal, said semiconductor memory device further comprising
a column decoder for outputting a predetermined column selection signal to gates of said first and fourth NMOS transistors in response to said column control signal.

4. A semiconductor memory device, comprising:

a memory cell array including a plurality of word lines, a plurality of bit line pairs arranged crossing said word lines, and a plurality of memory cells located at intersections of said word lines and said bit line pairs;

first and second data input/output line pairs for transmitting data output from said memory cell array and data input to said memory cell array;

connection means for selectively connecting one of said first and second data input/output line pairs and said bit line pair selected upon readout;

an equalizing means for equalizing the other pair of said first and second data input/output line pairs which is not used for data transmission;

control signal output means for outputting a control signal which alternately selects one of said first and second data input/output line pairs in response to a selection signal for selecting said bit line pair; and a column address buffer for receiving an externally applied column address signal and outputting a column control signal which changes in response to said column address signal, wherein said control signal output means includes
a counter for receiving said column control signal and alternately outputting first and second control signals which alternately selects one of said first and second data input/output line pairs in response to said column control signal, said equalizing means includes
a first inverter receiving said first control signal, a first NMOS transistor connected between said first data input/output line pair and having a gate which receives output of said first inverter, a second NMOS transistor having one end connected to one data input/output line of said first data input/output line pair, an other end receiving a predetermined precharge voltage, and a gate receiving the output of said first inverter, a third NMOS transistor having one end receiving said predetermined precharge voltage, an other end connected to an other data input/output line of said first data input/output line pair, and a gate receiving the output of said first inverter, a second inverter receiving said second control signal, a fourth NMOS transistor connected between said second data input/output line pair and having a gate receiving an output of said second inverter, a fifth NMOS transistor having one end connected to one data input/output line of said second data input/output line pair, an other end receiving said predetermined precharge voltage, and a gate receiving the output of said second inverter, and a sixth NMOS transistor having one end receiving said predetermined precharge voltage, an other end connected to an other data input/output line of said second data input/output line pair, and a gate receiving the output of said second inverter.

5. The semiconductor memory device according to claim 1, further comprising a preamplifier for amplifying data of a data input/output line pair of said first and second data input/output line pairs which is used for data transmission, and connection means for the preamplifier for connecting said preamplifier and the data input/output line pairs of said first and second data input/output line pairs which is used for data transmission.

6. A semiconductor memory device, comprising:

a memory cell array including a plurality of word lines, a plurality of bit line pairs arranged crossing said word lines, and a plurality of memory cells located at intersections of said word lines and said bit line pairs;

first and second data input/output line pairs for transmitting data output from said memory cell array and data input to said memory cell array;

connection means for selectively connecting one of said first and second data input/output line pairs and said bit line pair selected upon readout;

an equalizing means for equalizing the other pair of said first and second data input/output line pairs which is not used for data transmission;

control siqnal output means for outputting a control signal which alternately selects one of said first and second data input/output line pairs in response to a selection signal for selecting said bit line pair;

a column address buffer for receiving an externally applied column address signal and outputting a column control signal which changes in response to said column address signal;

a preamplifier for amplifying data of a data input/output line pair of said first and second data input/output line pairs which is used for data transmission; and connection means for the preamplifier for connecting said preamplifier and the data input/output line pairs of said first and second data input/output line pairs which is used for data transmission wherein said control signal output means includes a counter for receiving said column control signal and alternately outputting first and second control signals which alternately selects one of said first and second data input/output line pairs in response to said column control signal, and said connection means for the preamplifier includes a first NMOS transistor connected to one data input/output line of said first data input/output line pair and having a gate receiving said first control signal, a second NMOS transistor connected to an other data input/output line of said first data input/output line pair and having a gate receiving said first control signal, a third NMOS transistor connected to one data input/output line of said second data input/output line pair and having a gate receiving said second control signal, and a fourth NMOS transistor connected to an other data input/output line of said second data input/output line pair and having a gate receiving said second control signal.

7. A semiconductor memory device, comprising:

a memory cell array including a plurality of word lines, a plurality of bit line pairs arranged crossing said word lines, and a plurality of memory cells located at intersections of said word lines and said bit line pairs;

first and second data input/output line pairs for transmitting data output from said memory cell array and data input to said memory cell array;

connection means for selectively connecting one of said first and second data input/output line pairs and said bit line pair selected upon readout in response to prescribed control signals;

an equalizing means for equalizing the other pair of said first and second data input/output line pairs which is not used for data transmission;

a preamplifier for amplifying data of a data input/output line pair of said first and second data input/output line pairs which is used for data transmission;

a writing circuit for outputting an externally input data to a data input/output line pair of said first and second data input/output line pairs which is used for writing operation; and connection means for data transmission for connecting the data input/output line pair of said first and second data input/output line pairs which is used for data transmission with said preamplifier and said writing circuit in response to said prescribed control signals.

8. A semiconductor memory device, comprising:

a memory cell array including a plurality of word lines, a plurality of bit line pairs arranged crossing said word lines, and a plurality of memory cells located at intersections of said word lines and said bit line pairs;

a plurality of column select lines connected to respective bit line pairs;

first and second data input/output line pairs for transmitting data output from said memory cell array and data input to said memory cell array;

connection means for selectively connecting one of said first and second data input/output line pairs and said bit line pair selected upon readout; and an equalizing means for equalizing the other pair of said first and second data input/output line pairs which is not used for data transmission, wherein data are continuously read out on respective first and second data input/output line pairs by raising a voltage level of a word line to a read level, latching a plurality of data of memory cells connected to the word line and then selecting column select lines continuously.

9. A semiconductor memory device comprising:

a memory cell array including a plurality of word lines, a plurality of bit line pairs arranged crossing said word lines and a plurality of memory cells arranged at intersections of said word lines and said bit line pairs, first and second data line pairs for transmitting only data output from said memory cell array;

connection means for selectively connecting one data line pair of said first and second data line pairs and a bit line pair selected upon readout;

equalizing means for equalizing a data line pair of said first and second data line pairs which is not used for data transmission;

control signal output means for outputting a control signal which alternately selects one of said first and second data line pairs in response to a selection signal for selecting said bit line pair; and a column address buffer for receiving an externally applied column address signal and outputting a column control signal which changes in response to said column address signal, wherein said control signal output means includes
a counter for receiving said column control signal and alternately outputting first and second control signals for alternately selecting one of said first and second data line pairs in response to said column control signal.

10. A semiconductor memory device, comprising:

a memory cell array including a plurality of word lines, a plurality of bit line pairs arranged crossing said word lines and a plurality of memory cells arranged at intersections of said word lines and said bit line pairs, first and second data line pairs for transmitting only data output from said memory cell array;

connection means for selectively connecting one data line pair of said first and second data line pairs and a bit line pair selected upon readout;

equalizing means for equalizing a data line pair of said first and second data line pairs which is not used for data transmission;

control signal output means for outputting a control signal which alternately selects one of said first and second data line pairs in response to a selection signal for selecting said bit line pair; and a column address buffer for receiving an externally applied column address signal and outputting a column control signal which changes in response to said column address signal, wherein said control signal output means includes
a counter for receiving said column control signal and alternately outputting first and second control signals for alternately selecting one of said first and second data line pairs in response to said column control signal, and said counter includes
a first NMOS transistor having a gate which receives said column control signal,
a first inverter having an input end connected to one end of said first NMOS transistor,
a second inverter having an output end connected to the input end of said first inverter and an input end connected to an output end of said first inverter,
a capacitor having one end connected to an other end of said first NMOS transistor, and an other end which receives a ground potential,
a second NMOS transistor having one end connected to a connection point between said first NMOS transistor and said first capacitor, an other end receiving the ground potential, and a gate receiving a predetermined reset signal,
a third NMOS transistor having one end connected to said one end of said first NMOS transistor,
a fourth NMOS transistor having one end connected to an other end of said third NMOS transistor, an other end receiving the ground potential, and a gate connected to the connection point between said other end of said first NMOS transistor and said first capacitor,
a fifth NMOS transistor having one end connected to an output end of said first inverter and to the input end of said second inverter,
a third inverter having an input end receiving said column control signal and an output end connected to gates of said third and fifth NMOS transistors,
a sixth NMOS transistor having one end connected to an other end of said fifth NMOS transistor, and an other end receiving the ground potential,
a seventh NMOS transistor having one end connected to a gate of said sixth NMOS transistor, an other end receiving the ground potential, and a gate receiving said reset signal,
an eighth NMOS transistor having one end connected to the output end of said first inverter and to the input end of said second inverter, an other end connected to the gate of said sixth NMOS transistor and to said one end of said seventh NMOS transistor, and a gate receiving said column control signal,
a second capacitor having one end connected to said other end of said eighth NMOS transistor and an other end receiving the ground potential,
a ninth NMOS transistor having one end connected to the output end of said first inverter and to the input end of said second inverter, an other end receiving the ground potential, and a gate receiving said reset signal,
a tenth NMOS transistor having one end receiving said column control signal, and a gate connected to the output end of said first inverter and to the input end of said second inverter, and
an eleventh NMOS transistor having one end receiving said column control signal and a gate connected to said one end of said first NMOS transistor.

11. A semiconductor memory device, comprising:

a memory cell array including a plurality of word lines, a plurality of bit line pairs arranged crossing said word lines and a plurality of memory cells arranged at intersections of said word lines and said bit line pairs, first and second data line pairs for transmitting only data output from said memory cell array;

connection means for selectively connecting one data line pair of said first and second data line pairs and a bit line pair selected upon readout;

equalizing means for equalizing a data line pair of said first and second data line pairs which is not used for data transmission;

control signal output means for outputting a control signal which alternately selects one of said first and second data line pairs in response to a selection siqnal for selecting said bit line pair; and a column address buffer for receiving an externally applied column address signal and outputting a column control siqnal which changes in response to said column address siqnal, wherein said control signal output means includes
- a counter for receiving said column control signal and alternately outputting first and second control signals for alternately selecting one of said first and second data line pairs in response to said column control signal, and said connection means includes
- a first NMOS transistor having one end connected to one bit line of a predetermined bit line pair of said plurality of bit line pairs,
- a second NMOS transistor having one end connected to an other end of said first NMOS transistor, an other end connected to one data line of said first data line pair, and a gate receiving said first control signal,
- a third NMOS transistor having one end connected to said other end of said first NMOS transistor, and an other end connected to one data line of said second data line pair, and receiving said second control signal,
- a fourth NMOS transistor having one end connected to the other bit line of said predetermined bit line pair,
- a fifth NMOS transistor having one end connected to an other end of said first fourth NMOS transistor, an other end connected to an other data line of said first data line pair, and a gate receiving said first control signal, and
- a sixth NMOS transistor having one end connected to said other end of said fourth NMOS transistor, an other end connected to the other data line of said second data line pair, and a gate receiving said second control signal, said semiconductor memory device further comprising
- a column decoder for outputting a predetermined column selection signal to gates of said first and fourth NMOS transistors in response to said column control signal.

12. A semiconductor memory device, comprising:

a memory cell array including a plurality of word lines, a plurality of bit line pairs arranged crossing said word lines and a plurality of memory cells arranged at intersections of said word lines and said bit line pairs, first and second data line pairs for transmitting only data output from said memory cell array;

connection means for selectively connecting one data line pair of said first and second data line pairs and a bit line pair selected upon readout;

equalizing means for equalizing a data line pair of said first and second data line pairs which is not used for data transmission;

control signal output means for outputting a control signal which alternately selects one of said first and second data line pairs in response to a selection signal for selecting said bit line pair; and a column address buffer for receiving an externally applied column address signal and outputting a column control signal which changes in response to said column address signal, wherein said control signal output means includes
- a counter for receiving said column control signal and alternately outputting first and second control signals for alternately selecting one of said first and second data line pairs in response to said column control signal, and said equalizing means includes
- a first inverter for receiving said first control signal,
- a first NMOS transistor connected between said first data line pair and having a gate which receives an output of said first inverter,
- a second NMOS transistor having one end connected to one data line of said first data line pair, an other end receiving a predetermined precharge voltage, and a gate receiving the output of said first inverter,
- a third NMOS transistor having one end receiving said predetermined precharge voltage, an other end connected to the other data line of said first data line pair, and a gate receiving the output of said first inverter,
- a second inverter for receiving said second control signal,
- a fourth NMOS transistor connected between said second data line pair, and having a gate receiving an output of said second inverter,
- a fifth NMOS transistor having one end connected to one data line of said second data line pair, an other end receiving said predetermined prechargge voltage, and a gate receiving the output of said second inverter,
- a sixth NMOS transistor having one end receiving said predetermined precharge voltage, an other end connected to the other data line of said second data line pair, and a gate receiving the output of said second inverter.

13. The semiconductor memory device according to claim 9, further comprising
- a preamplifier for amplifying data of a data line pair of said first and second data line pairs which is used for data transmission, and
- connection means for preamplifier for connecting said preamplifier with the data line pair of said first and second data line pairs which is used for data transmission.

14. The semiconductor memory device according to claim 13, wherein said connection means for preamplifier includes
- a first NMOS transistor connected with one data line of said first data line pair and having a gate which receives said first control signal,
- a second NMOS transistor connected with an other data line of said first data line pair and having a gate which receives said first control signal,
- a third NMOS transistor connected with one data line of said second data line pair and having a gate which receives said second control signal, and
- a fourth NMOS transistor connected with an other data line of said second data line pair and having a gate which receives said second control signal.

15. A semiconductor memory device, comprising:

a memory cell array including a plurality of word lines, a plurality of bit line pairs arranged crossing said word lines and a plurality of memory cells arranged at intersections of said word lines and said bit line pairs, first and second data line pairs for transmitting only data output from said memory cell array;

connection means for selectively connecting one data line pair of said first and second data line pairs and a bit line pair selected upon readout in response to prescribed control signals;

equalizing means for equalizing a data line pair of said first and second data line pairs which is not used for data transmission;

a preamplifier for amplifying data of a data line pair of said first and second data line pairs which is used for data transmission; and connection means for data transmission for connecting the data line pair of said first and second data line pairs which is used for data transmission with said preamplifier in response to said prescribed control siqnals.

16. A semiconductor memory device comprising:

a memory cell array including a plurality of word lines, a plurality of bit line pairs arranged crossing said word lines and a plurality of memory cells arranged at intersections of said word lines and said bit line pairs, a plurality of column select lines connected to respective bit line pairs;

first and second data line pairs for transmitting only data output from said memory cell array;

connection means for selectively connecting one data line pair of said first and second data line pairs and a bit line pair selected upon readout;

equalizing means for equalizing a data line pair of said first and second data line pairs which is not used for data transmission, wherein data are continuously read out on respective first and second data line pairs by raising a voltage level of a word line to a read level, latching a plurality of data of memory cells connected to the word line and then selecting column select lines continuously.

17. A semiconductor memory device comprising:

a memory cell array including a plurality of word lines, a plurality of bit line pairs arranged crossing said word lines, and a plurality of memory cells located at intersections of said word lines and said bit line pairs;

a sub data line pair for transmitting data output from said memory cell array;

first and second main data line pairs for transmitting data received from said sub data line pair;

connection means for selectively connecting said sub data line pair and one main data line pair of said first and second main data line pairs;

equalizing means for equalizing a main data line pair of said first and second main data line pairs which is not used for data transmission;

control signal output means for outputting a control signal which alternately selects one of said first and second main data line pairs in response to a selection signal for selecting said bit line pair; and a column address buffer for receiving an externally applied column address signal and outputting a column control signal which changes in response to said column address signal, wherein said control signal output means includes a counter for receiving said column control signal and alternately outputting first and second control signals for alternately selecting one of said first and second main data line pairs in response to said column control signal.

18. A semiconductor memory device, comprising:

a memory cell array including a plurality of word lines, a plurality of bit line pairs arranged crossing said word lines, and a plurality of memory cells located at intersections of said word lines and said bit line pairs;

a sub data line pair for transmitting data output from said memory cell array;

first and second main data line pairs for transmitting data received from said sub data line pair;

connection means for selectively connecting said sub data line pair and one main data line pair of said first and second main data line pairs;

equalizing means for equalizing a main data line pair of said first and second main data line pairs which is not used for data transmission;

control signal output means for outputting a control signal which alternately selects one of said first and second main data line pairs in response to a selection signal for selecting said bit line pair; and a column address buffer for receiving an externally applied column address signal and outputting a column control signal which changes in response to said column address signal, wherein said control signal output means includes a counter for receiving said column control signal and alternately outputting first and second control signals for alternately selecting one of said first and second main data line pairs in response to said column control signal, and said counter includes a first NMOS transistor having a gate which receives said column control signal, a first inverter having an input end connected to one end of said first NMOS transistor, a second inverter having an output end connected to the input end of said first inverter, and an input end connected to an output end of said first inverter, a capacitor having one end connected to an other end of said first NMOS transistor, and an other end receiving a ground potential, a second NMOS transistor having one end connected to a connection point between said first NMOS transistor and said first capacitor, an other end receiving the ground potential, and a gate receiving a predetermined reset signal, a third NMOS transistor having one end connected to said one end of said first NMOS transistor, a fourth NMOS transistor having one end connected to an other end of said third NMOS transistor, an other end receiving the ground potential, and a gate connected to the connection point between said other end of said first NMOS transistor and said first capacitor, a fifth NMOS transistor having one end connected to the output end of said first inverter and to the input end of said second inverter, a third inverter having an input end receiving said column control signal, and an output end connected to gates of said third and fifth NMOS transistors, a sixth NMOS transistor having one end connected to an other end of said fifth NMOS transistor, and an other end receiving the ground potential, a seventh NMOS transistor having one end connected to a gate of said sixth NMOS transistor, an other end receiving the ground potential, and a gate receiving said reset signal, an eighth NMOS transistor having one end connected to the output end of said first inverter and to the input end of said second inverter, an other end connected to the gate of said sixth NMOS transistor and said one end of said seventh NMOS transistor, and a gate receiving said column control signal, a second capacitor having one end connected to said other end of said eighth NMOS transistor, and an other end receiving the ground potential, an ninth NMOS transistor having one end connected to the output end of said first inverter and to the input end of said second inverter, an other end receiving the ground potential, and a gate receiving said reset signal, a tenth NMOS transistor having one end receiving said column control signal, and a gate connected to the output end of said first inverter and to the input end of said second inverter, and an eleventh NMOS transistor having one end receiving said column control signal, and a gate connected to said one end of said first NMOS transistor.

19. The semiconductor memory device according to claim 17, wherein said connection means includes
  a first NMOS transistor having one end connected to one sub data line of said sub data line pair, an other end connected to one main data line of said first main data line pair, and a gate receiving said first control signal,
  a second NMOS transistor having one end connected to said one sub data line of said sub data line pair, an other end connected to one main data line of said second main data line pair, and receiving said second control signal,
  a third NMOS transistor having one end connected to an other sub data line of said sub data line pair, an other end connected to an other main data line of said first main data line pair, and a gate receiving said first control signal, and
  a fourth NMOS transistor having one end connected to said other sub data line of said sub data line pair, an other end connected to said other main data line of said second main data line pair, and a gate receiving said second control signal.

20. A semiconductor memory device, comprising:
a memory cell array including a plurality of word lines, a plurality of bit line pairs arranged crossing said word lines, and a plurality of memory cells located at intersections of said word lines and said bit line pairs;
a sub data line pair for transmitting data output from said memory cell array;
first and second main data line pairs for transmitting data received from said sub data line pair;
connection means for selectively connecting said sub data line pair and one main data line pair of said first and second main data line pairs;
equalizing means for equalizing a main data line pair of said first and second main data line pairs which is not used for data transmission;
control signal output means for outputting a control signal which alternately selects one of said first and second main data line pairs in response to a selection signal for selecting said bit line pair; and
a column address buffer for receiving an externally applied column address signal and outputting a column control signal which changes in response to said column address signal, wherein said control siqnal output means includes
  a counter for receiving said column control signal and alternately outputting first and second control signals for alternately selecting one of said first and second main data line pairs in response to said column control signal, and said equalizing means includes
  a first inverter for receiving said first control signal,
  a first NMOS transistor connected between said first main data line pair and having a gate which receives an output of said first inverter,
  a second NMOS transistor having one end connected to one main data line of said first main data line pair, an other end receiving a predetermined precharge voltage, and a gate receiving the output of said first inverter,
  a third NMOS transistor having one end receiving said predetermined precharge voltage, an other end connected to the other main data line of said first main data line pair, and a gate receiving the output of said first inverter,
  a second inverter for receiving said second control signal,
  a fourth NMOS transistor connected between said second main data line pair and having a gate which receives an output of said second inverter,
  a fifth NMOS transistor having one end connected to one main data line of said second main data line pair, an other end receiving said predetermined precharge voltage, and a gate receiving the output of said second inverter, and
  a sixth NMOS transistor having one end receiving said predetermined precharge voltage, an other end connected to the other main data line of said second main data line pair and a gate receiving the output of said second inverter.

21. The semiconductor memory device according to claim 17, further comprising
an input/output circuit for inputting and outputting data of a main data line pair of said first and second main data line pairs which is used for data transmission, and
connection means for the input/output circuit for connecting the main data line pair of said first and second main data line pairs which is used for data transmission with said input/output circuit.

22. A semiconductor memory device, comprising:
a memory cell array including a plurality of word lines, a plurality of bit line pairs arranged crossing said word lines, and a plurality of memory cells located at intersections of said word lines and said bit line pairs;
a sub data line pair for transmitting data output from said memory cell array;
first and second main data line pairs for transmitting data received from said sub data line pair;
connection means for selectively connecting said sub data line pair and one main data line pair of said first and second main data line pairs;
equalizing means for equalizing a main data line pair of said first and second main data line pairs which is not used for data transmission;
control signal output means for outputting a control siqnal which alternately selects one of said first and second main data line pairs in response to a selection signal for selecting said bit line pair;

a column address buffer for receiving an externally applied column address siqnal and outputting a column control signal which changes in response to said column address signal;

an input/output circuit for inputting and outputting data of a main data line pair of said first and second main data line pairs which is used for data transmission; and connection means for the input/output circuit for connecting the main data line pair of said first and second main data line pairs which is used for data transmission with said input/output circuit, wherein said control signal output means includes
a counter for receiving said column control signal and alternately outputting first and second control signals for alternately selecting one of said first and second main data line pairs in response to said column control signal, and said connection means for the input/output circuit includes a first NMOS transistor connected to one main data line of said first main data line pair and having a gate which receives said first control signal, a second NMOS transistor connected to an other main data line of said first main data line pair and having a gate which receives said first control signal, a third NMOS transistor connected to one main data line of said second main data line pair and having a gate which receives said second control signal, and a fourth NMOS transistor connected to an other main data line of said second main data line pair and having a gate which receives said second control signal.

* * * * *